United States Patent
Dai et al.

(10) Patent No.: US 9,483,993 B2
(45) Date of Patent: Nov. 1, 2016

(54) GATE DRIVE CIRCUIT

(71) Applicant: Shenzhen China Star Optoelectronics Technology Co., Ltd., Shenzhen, Guangdong (CN)

(72) Inventors: Ronglei Dai, Guangdong (CN); Yao Yan, Guangdong (CN); Juncheng Xiao, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 14/418,618

(22) PCT Filed: Jan. 20, 2015

(86) PCT No.: PCT/CN2015/071134
§ 371 (c)(1),
(2) Date: May 10, 2016

(87) PCT Pub. No.: WO2016/106888
PCT Pub. Date: Jul. 7, 2016

(65) Prior Publication Data
US 2016/0247442 A1 Aug. 25, 2016

(30) Foreign Application Priority Data
Dec. 31, 2014 (CN) .......................... 2014 1 0856592

(51) Int. Cl.
*G09G 3/36* (2006.01)
*G11C 19/28* (2006.01)

(52) U.S. Cl.
CPC ............. *G09G 3/3677* (2013.01); *G11C 19/28* (2013.01); *G09G 2300/0408* (2013.01); *G09G 2310/0286* (2013.01)

(58) Field of Classification Search
CPC ............. G09G 3/3648; G09G 3/3674; G09G 3/3677; G09G 2300/0408; G09G 2310/0286; G11C 19/28
See application file for complete search history.

(56) References Cited

U.S. PATENT DOCUMENTS

| | | | | |
|---|---|---|---|---|
| 8,253,680 B2* | 8/2012 | Jang | ....................... | G11C 19/28 345/100 |
| 8,731,136 B2* | 5/2014 | Shin | ....................... | G11C 19/28 377/64 |

(Continued)

FOREIGN PATENT DOCUMENTS

| CN | 101221730 A | 7/2008 |
|---|---|---|
| CN | 101295481 A | 10/2008 |

(Continued)

OTHER PUBLICATIONS

International Search Report and Written Opinion, Jan. 20, 2015, China.

*Primary Examiner* — Patrick O'Neill
(74) *Attorney, Agent, or Firm* — Kim Winston LLP (57) ABSTRACT

A gate drive circuit is disclosed. The gate drive circuit comprises multi-stage of GOA drive unit, and each stage of GOA drive unit comprises a signal afferent unit, used for outputting a pull-down control signal; an output unit, used for outputting a first gate signal and a second gate signal; a pull-up control unit, used for outputting a pull-up control signal; and a pull-up sustaining unit, used for pulling up an electric potential of the control end of the output unit to an electric potential of the direct-current power supply according to the pull-up control signal, so that the first gate signal and the second gate signal are maintained in a high-level state.

10 Claims, 7 Drawing Sheets

(56) References Cited

U.S. PATENT DOCUMENTS

| | | | | |
|---|---|---|---|---|
| 8,773,413 | B2* | 7/2014 | Zhou | G09G 3/3674 345/100 |
| 8,878,765 | B2* | 11/2014 | Shin | G09G 3/20 345/100 |
| 9,030,399 | B2* | 5/2015 | Tseng | G09G 3/20 345/100 |
| 2009/0167668 | A1* | 7/2009 | Kim | G09G 3/3677 345/100 |
| 2014/0159997 | A1* | 6/2014 | Chen | G09G 3/3611 345/87 |
| 2016/0125828 | A1* | 5/2016 | Xiao | G09G 3/3677 345/214 |
| 2016/0125831 | A1* | 5/2016 | Xiao | G09G 3/3696 345/92 |

FOREIGN PATENT DOCUMENTS

| | | |
|---|---|---|
| CN | 102081897 A | 6/2011 |
| CN | 103208262 A | 7/2013 |
| CN | 103578433 A | 2/2014 |

* cited by examiner

GATE DRIVE CIRCUIT

CROSS REFERENCE TO RELATED APPLICATION

The present application claims benefit of Chinese patent application CN 201410856592.7, entitled "Gate Drive Circuit" and filed on Dec. 31, 2014, the entirety of which is incorporated herein by reference.

FIELD OF THE INVENTION

The present disclosure relates to the technical field of display, and particularly to a gate drive circuit for a display device.

BACKGROUND OF THE INVENTION

In the prior art, during the manufacturing procedure of array of a liquid crystal display panel, the gate drive circuit is generally formed on the array substrate through Gate Driver On Array (GOA) technology, so that the gate lines can be driven in a row-by-row scanning mode. Through the GOA technology, the bonding procedure of external Integrated Circuit (IC) can be saved, and the integration level of the liquid crystal display panel can be improved.

Since the emerging of Low Temperature Poly-Silicon (LTPS), the designing of Integrated Circuits on the peripheral region of the display panel has become a focus in the industry due to the super-high mobility ratio of the carriers of LTPS semiconductor. The types of Thin Film Transistor (TFT) can be regulated by LTPS through ion arrangement technology, and thus the GOA circuit can be configured to be N-type Metal Oxide Semiconductor (NMOS), P-type Metal Oxide Semiconductor (PMOS), or Complementary Metal Oxide Semiconductor (CMOS). However, with respect to the costs of the photomask, CMOS and NMOS need more manufacturing procedures compared with PMOS, so that the manufacturing costs of CMOS and NMOS would increase to a large extent. Moreover, the CMOS type circuit structure is complex, and it is hard to realize an ultra-narrow frame design. In particular, with respect to small sized display devices (such as mobile phone screens), the size of the frame is especially important to obtain a better user experience.

In addition, the power consumption of the GOA circuit is an important reference index of the performance of the display device. The structure of the LTPS GOA drive circuit in the prior art is complex, and the power consumption thereof is high.

SUMMARY OF THE INVENTION

The present disclosure aims to solve the technical problem of complex structure of the LTPS GOA drive circuit in the prior art.

In order to solve the aforesaid technical problem, the embodiments of the present disclosure provide a gate drive circuit, comprising a multi-stage GOA drive unit, wherein each stage of GOA drive unit comprises: a signal afferent unit, used for outputting a pull-down control signal according to an afferent signal; an output unit, wherein a control end thereof is coupled with an output end of the signal afferent unit so as to pull down an electric potential of an output end of a first gate signal according to the pull-down control signal and a first clock signal and an electric potential of an output end of a second gate signal according to the pull-down control signal and a second clock signal, so that the stage of GOA drive unit outputs a first gate signal and a second gate signal, said first gate signal and said second gate signal being scanning signals of two adjacent gate lines; a pull-up control unit, used for outputting a pull-up control signal according to a pull-up signal; and a pull-up sustaining unit, coupled among an output end of the pull-up control unit, the control end of the output unit, the output end of the second gate signal, and a direct-current power supply, and used for pulling up an electric potential of the control end of the output unit to an electric potential of the direct-current power supply according to the pull-up control signal, so that the first gate signal and the second gate signal are both maintained in a high-level state.

According to one embodiment, the output end of the second gate signal of each stage of GOA drive unit is coupled with an input end of a signal afferent unit of a next stage of GOA drive unit, so that the next stage of GOA drive unit is turned on according to the second gate signal output by a present stage of GOA drive unit.

According to one embodiment, the first clock signal and the second clock signal of each stage of GOA drive unit and the first clock signal and the second clock signal of the next stage of GOA drive unit constitute a clock cycle, and are staggered and connected with one another in time-sequence.

According to one embodiment, said output unit comprises: a first output transistor, wherein a gate thereof is coupled with the output end of the signal afferent unit, a first end thereof receives a first clock signal, and a second end thereof outputs the first gate signal; and a second output transistor, wherein a gate thereof is coupled with the output end of the signal afferent unit, a first end thereof receives a second clock signal, and a second end thereof outputs the second gate signal.

According to one embodiment, the gate drive circuit further comprises a voltage step-down unit, which comprises a first voltage step-down capacitor and/or a second voltage step-down capacitor. A first end of the first voltage step-down capacitor is coupled with the control end of the output unit, a second thereof is coupled with the second end of said first output transistor so as to pull down or pull up the electric potential of the control end of the output unit according to the first clock signal. A first end of the second voltage step-down capacitor is coupled with the control end of the output unit, a second thereof is coupled with the second end of said second output transistor so as to pull down the electric potential of the control end of the output unit according to the second clock signal.

According to one embodiment, the pull-up signal of each stage of GOA drive unit is the first clock signal of the next stage of GOA drive unit, or the first gate signal output by the next stage of GOA drive unit.

According to one embodiment, said pull-up sustaining unit comprises: a first pull-up transistor, a gate thereof being coupled with the output end of said pull-up control unit, a first end thereof being coupled with the direct-current power supply, and a second end thereof being coupled with the control end of the output unit; and a second pull-up transistor, a gate thereof being coupled with the output end of said pull-up control unit, a first end thereof being coupled with the direct-current power supply, and a second end thereof being coupled with the output end of the second gate signal of the output unit. The first pull-up transistor and the second pull-up transistor are turned on when the pull-up control signal is effective, so that the electric potential of the control end of the output unit is pulled up to the electric potential of the direct-current power supply, and the second gate signal is pulled up to the electric potential of the direct-current power supply.

According to one embodiment, said pull-up sustaining unit further comprises: a leak-proofing transistor, a gate thereof being coupled with the control end of the output unit, a first end thereof being coupled with the direct-current power supply, and a second end thereof being coupled with the gates of the first pull-up transistor and the second pull-up transistor. Said leak-proofing transistor is turned on when the control end of the output unit is in a low-level state, so that the gates of the first pull-up transistor and the second pull-up transistor are both maintained in a high-level state, and leakage current from the direct-current power supply to the control end of the output unit is prevented.

According to one embodiment, said pull-up control unit comprises a pull-up control transistor, a gate thereof being short circuited with a first end thereof so as to receive the pull-up signal, and a second end thereof being coupled with the gates of the first pull-up transistor and the second pull-up transistor.

According to one embodiment, said signal afferent unit comprises a signal afferent transistor, a gate thereof being short circuited with a first end thereof so as to receive afferent signal, and a second end thereof being coupled with the control end of the output unit.

Compared with the GOA drive unit in the prior art, the present disclosure has the following advantages.

1. According to the present disclosure, the two adjacent gate lines are driven by one stage of GOA drive unit, so that the number of TFT used in the gate drive circuit can be reduced and the power consumption of the circuit can be lowered. In this manner, the structure of the scanning drive circuit can be simplified, and the narrow frame design of the display device can be realized.

2. According to the present disclosure, the first clock signals and the second clock signals of two adjacent stages of GOA drive unit constitute a clock cycle, and are staggered and connected with one another in time-sequence. In this manner, the pull-up sustaining function can be realized, and the technical problem of lengthy circuit structure of the pull-up sustaining circuit of the traditional LTPS GOA circuit during the non-effective period can be solved.

3. According to the present disclosure, during the non-effective period of the GOA drive unit, the electric potential of Q[N] can be pulled up continuously by the high electric potential of the direct-current power supply, and the gate scanning signal output therein can be pulled up to the high-level state, so that the completeness of the sequential function of the circuit can be ensured.

4. According to the present disclosure, the pull-up sustaining unit is provided with the leak-proofing transistor, so that the leakage current from the direct-current power supply to Q[N] during the effective period of the present stage of GOA drive unit can be prevented and the stability of the drive circuit can be guaranteed.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art and constitute one part of the description. The drawings are not used for limiting the present disclosure. In the drawings.

DETAILED DESCRIPTION OF THE EMBODIMENTS

The circuit structure and working principle of GOA drive unit will be illustrated in detail hereinafter in combination with the accompanying drawings and taking the LTPS GOA gate drive circuit with P-type transistor as an example to make the purpose, technical solutions, and advantages of the present disclosure more clear.

Embodiment 1

Figure 1A:
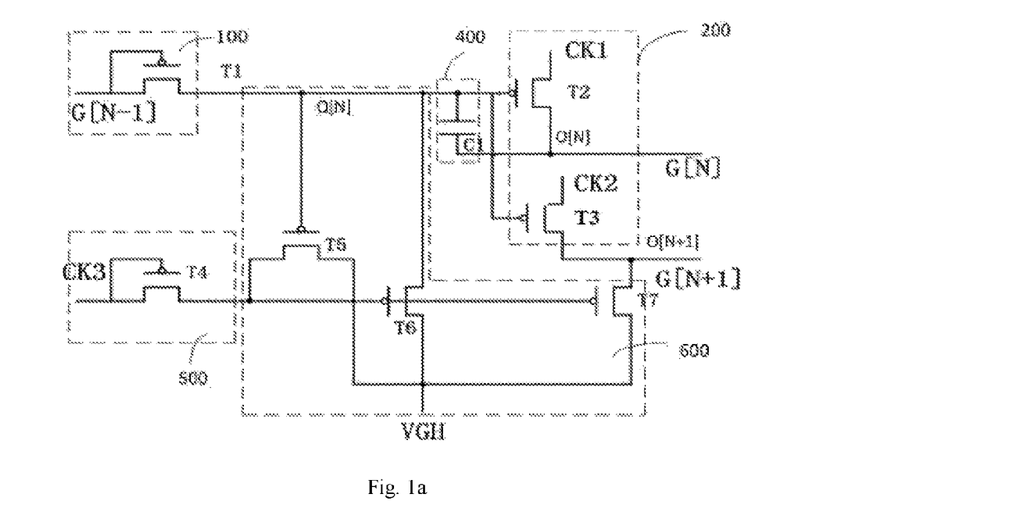
FIG. 1a is a structural diagram of a GOA drive unit of stage N according to embodiment 1 of the present disclosure.
Figure 1B:
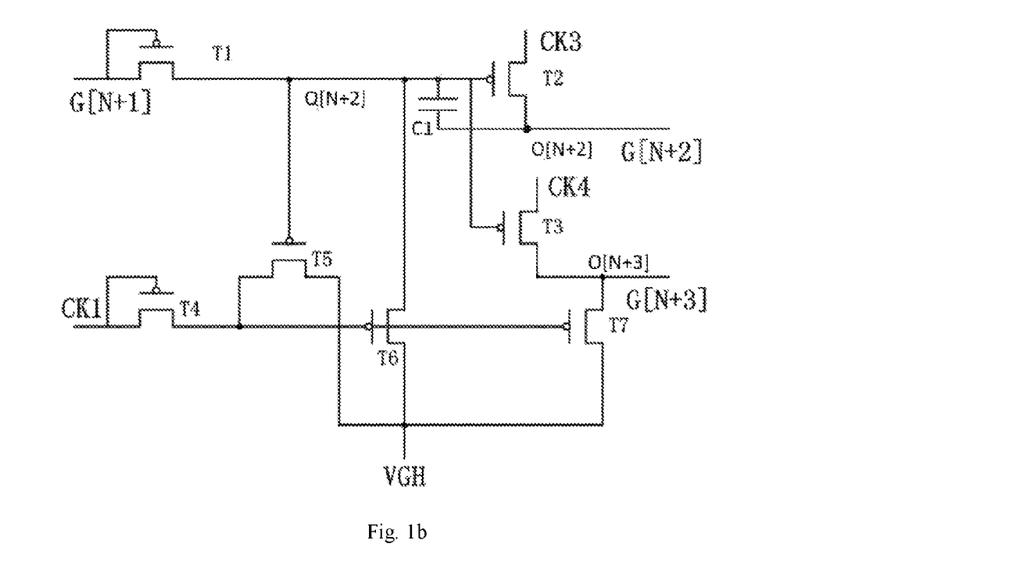
FIG. 1b is a structural diagram of a GOA drive unit of stage N+2 according to embodiment 1 of the present disclosure.

The present embodiment provides a gate drive circuit, which comprises a multi-stage GOA drive unit, each stage of GOA drive unit outputting the scanning signals of two adjacent gate lines. FIG. 1a and FIG. 1b are structural diagrams of a GOA drive unit of stage N and a GOA drive unit of stage N+2 of the gate drive circuit according to the present embodiment respectively. FIG. 1a and FIG. 1b each show two adjacent stages of the multi-stage GOA drive unit only. Since each stage of drive circuit generates the scanning signals of two adjacent gate lines, in order to facilitate the illustration thereof, a former stage of GOA drive unit is represent by "N," and a latter stage of GOA drive unit is represent by "N+2." The transistors as shown in FIG. 1a and FIG. 1b are all P-type transistors.

As shown in FIG. 1a, the GOA drive unit of stage N comprises a signal afferent unit 100, an output unit 200, a voltage step-down unit 400, a pull-up control unit 500, and a pull-up sustaining unit 600.

The signal afferent unit 100 comprises a signal afferent transistor T1. The gate of T1 is short circuited with the first end thereof so as to receive the afferent signal. According to the present embodiment, the afferent signal is preferably the gate signal G[N−1] output by the GOA drive unit of stage N−2. The second end of T1 is coupled with the control end of the output unit 200 (Q[N] as shown in FIG. 1a), and the second end of T1 outputs a pull-down control signal KD[N] when the afferent signal arrives.

A control end of the output unit 200 is coupled with an output end of the signal afferent unit 100 so as to pull down an electric potential of an output end of a first gate signal (O[N] as shown in FIG. 1a) according to the pull-down control signal KD[N] and a first clock signal CK1, and an electric potential of an output end of a second gate signal (O[N+1] as shown in FIG. 1a) according to the pull-down control signal KD[N] and a second clock signal CK2. Therefore, the GOA drive unit of stage N outputs a first gate signal G[N] and a second gate signal G[N+1], said first gate signal G[N] and said second gate signal G[N+1] being scanning signals of two adjacent gate lines.

Specifically, as shown in FIG. 1a, the output unit 200 comprises a first output transistor T2 and a second output transistor T3.

The gate of the first output transistor T2 is coupled with the output end of the signal afferent unit 100 and receives the pull-down control signal KD[N]. The first end of T2 receives the first clock signal CK1, and the second end thereof, serving as an output end of the first gate signal, outputs the first gate signal G[N].

The gate of the second output transistor T3 is coupled with the output end of the signal afferent unit 100 and receives the pull-down control signal KD[N]. The first end of T3 receives the second clock signal CK2, and the second end thereof, serving as an output end of the second gate signal, outputs the second gate signal G[N+1].

The voltage step-down unit 400 comprises a first voltage step-down capacitor C1. The first end of C1 is coupled with the control end of the output unit 200, and the second end of C1 is coupled with the second end (O[N] as shown in FIG. 1a) of T2 so as to pull down or pull up the electric potential of the control end of the output unit 200, i.e., the electric potential of Q[N], according to the first clock signal CK1. It should be noted that, during the effective period of the gate line of row N, the first voltage step-down capacitor C1 can pull down the electric potential of Q[N], so that the first output transistor T2 can output normally; while during the effective period of the gate line of row N+1, the first voltage step-down capacitor C1 can also pull up the electric potential of Q[N] appropriately, so that the second output transistor T3 can be turned off rapidly when the gate line of row N+1 is switched over from an effective state to a non-effective state.

The pull-up control unit 500 outputs a pull-up control signal KU[N] according to a pull-up signal. According to the present embodiment, the pull-up signal is preferably a clock signal CK3. As shown in FIG. 1b, the clock signal CK3 is also the first clock signal output to GOA drive unit of stage N+2. The pull-up control unit 500 comprises a pull-up control transistor T4. The gate of T4 is short circuited with the first end thereof so as to receive the clock signal CK3. The second end of T4 outputs the pull-up control signal KU[N] when the clock signal CK3 arrives.

The pull-up sustaining unit 600 is coupled between an output end of the pull-up control unit 500, the control end of the output unit 200, the output end of the second gate signal (O[N+1] as shown in FIG. 1a), and a direct-current power supply VGH, and used for pulling up an electric potential of Q[N] to an electric potential of the direct-current power supply VGH according to the pull-up control signal KU[N], so that T2 and T3 are both turned off and the second gate signal G[N+1] is pulled up to a high-level state. In this manner, after the scanning driving of the gate lines of row N and row N+1 is performed by the GOA drive unit of stage N, the first gate signal G[N] and the second gate signal G[N+1] are maintained in a high-level state by the direct-current power supply VGH, until the afferent signal of a next frame arrives.

Specifically, the pull-up sustaining unit 600 comprises a first pull-up transistor T6 and a second pull-up transistor T7.

The gate of T6 is coupled with the output end of the pull-up control unit 500, the first end thereof is coupled with the direct-current power supply VGH, and the second end thereof is coupled with the control end of the output unit 200 (Q[N] as shown in FIG. 1a). The gate of T7 is coupled with the output end of the pull-up control unit 500, the first end thereof is coupled with the direct-current power supply VGH, and the second end thereof is coupled with the output end of the second gate signal (O[N+1] as shown in FIG. 1a).

The pull-up sustaining unit 600 further comprises a leak-proofing transistor T5. The gate of T5 is coupled with the control end of the output unit 200, the first end thereof is coupled with the direct-current power supply VGH, and the second end thereof is coupled with the gates of the first pull-up transistor T6 and the second pull-up transistor T7. T5 is turned on when Q[N] is in a low-level state, so that the gates of the first pull-up transistor T6 and the second pull-up transistor T7 are maintained in a high-level state, and T6 as well as T7 are both turned off. Therefore, leakage current from the direct-current power supply VGH to Q[N] can be prevented.

The structure of the GOA drive unit of stage N+2 is the same as that of the GOA drive unit of stage N, however, the afferent signal and the clock signal of the GOA drive unit of stage N+2 are different from those of the GOA drive unit of stage N.

As shown in FIG. 1b, in the GOA drive unit of stage N+2, the afferent signal received by T1 is the second gate signal G[N+1] output by the GOA drive unit of stage N. The first clock signal received by the first end of T2 is CK3, and the second clock signal received by the first end of T3 is CK4. The gate of T4 is short circuited with the first end thereof so as to receive the clock signal CK1. That is, in the GOA drive units of a present stage and a next stage, the input positions of CK1 and CK3 are exchanged, and the input positions of CK2 and CK4 are exchanged as well. The adjacent stages are all configured in the above manner.

It should be noted that, the first clock signal CK1 and the second clock signal CK2 of the GOA drive unit of stage N and the first clock signal CK3 and the second clock signal CK4 of the GOA drive unit of stage N+2 constitute a clock cycle, and are staggered and connected with one another in time-sequence. That is, the pulse durations of CK1, CK2, CK3, and CK4 are all 25 percent of a clock cycle. In the GOA drive unit provided by the present embodiment, the scanning driving of the gate lines of row N and row N+1 can be performed under the circumstance that a relative less number of transistors are used through configuring the operational sequence of CK1 to CK4 in a reasonable manner and regulating the electric potential of Q[N] by the voltage step-down unit 400. During the non-effective period of the present stage of drive unit, Q[N] can be maintained in the high-level state, so that the first gate signal G[N] and the second gate signal G[N+1] can both be maintained in the high-level state.

As shown in FIGS. 1a and 1b, according to the present embodiment, the output end of the second gate signal (O[N+1] as shown in FIG. 1a) of the GOA drive unit of stage N is coupled with an input end of a signal afferent unit 100 of the GOA drive unit of stage N+2, so that the GOA drive unit of stage N+2 is turned on according to the second gate signal G[N+1] output by the GOA drive unit of stage N.

Figure 2:
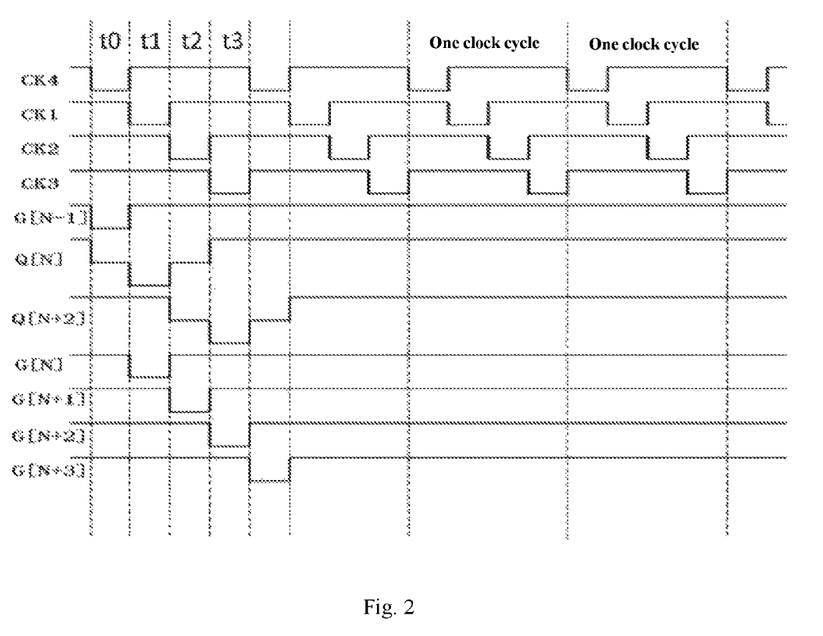
FIG. 2 is an operational sequence diagram of the GOA drive unit according to embodiment 1 of the present disclosure.

The working principle of the GOA drive unit of stage N will be illustrated in detail hereinafter with reference to the signal sequence diagram as shown in FIG. 2. It can be seen from FIG. 2 that, the time periods t0 to t3 constitute a clock cycle, and t0, t1, t2, and t3 each account for 25 percent of the clock cycle.

During the time period t0, the afferent signal G[N−1] jumps from a high-level state to a low-level state, and T1 is turned on. The pull-down control signal KD[N] output by T1 is in the low-level state, and thus the electric potential of Q[N] is pulled down to a first low-level voltage. Since Q[N] is in the low-level state, T2, T3, and T5 are all turned on. Since T2 is turned on and CK1 is in the high-level state, the first gate signal G[N] output therein is maintained in the high-level state. Since T3 is turned on and CK2 is in the high-level state, the second gate signal G[N+1] output by T3 is maintained in the high-level state.

Since CK3 is in the high-level state, T4 is turned off. T5 is turned on, so that the gates of T6 and T7 are both maintained in the high-level voltage VGH, and T6 as well as T7 are both turned off. In this manner, T6 and T7 can be maintained in the stable turned-off state, so that the leakage current from the high-level direct-current power supply VGH to Q[N] can be prevented, and the stability of the GOA drive unit can be ensured.

During the time period t1, the afferent signal G[N−1] jumps from the low-level state to the high-level state, and T1 is turned off. Q[N] is in the low-level state, and T2, T3, and T5 are all turned on. Since T3 is turned on and CK2 is in the high-level state, the second gate signal G[N+1] output by T3 is maintained in the high-level state. Since T2 is turned on, and CK1 jumps from the high-level state to the low-level state, the first gate signal G[N] output by T2 jumps to the low-level state. At an initial moment of the time period t1, since the second end (O[N] as shown in FIG. 1a) of the capacitor C1 jumps from the high-level state to the low-level state, the first end (Q[N] as shown in FIG. 1a) of the capacitor C1 changes from the first low-level voltage to a lower second low-level voltage. According to the present embodiment, the gate of T2 is coupled with Q[N], and the first end of T2 is the source and used for receiving the first clock signal CK1. Since T2 is the P-type transistor and the gate thereof has the lower second low-level voltage, a negative voltage difference can be maintained between the gate and the source of T2 in the case that CK1 jumps to the low-level state. In this case, T2 is still in the turned-on state and can output the first gate signal G[N] normally.

During the time period t2, the afferent signal G[N−1] is maintained in the high-level state, and T1 is turned off. Q[N] is in the low-level state, and T2, T3, and T5 are all turned on. At an initial moment of the time period t2, Q[N] has the second low-level voltage, and T2 as well as T3 are both turned on. Since T3 is turned on, and CK2 jumps from the high-level state to the low-level state, the second gate signal G[N+1] output by T3 is in the low-level state. Since T2 is turned on, and CK1 jumps from the low-level state to the high-level state, the first gate signal G[N] output by T2 is in the high-level state. Since the second end of the capacitor C1 jumps from the low-level state to the high-level state, Q[N] is pulled up from the second low-level voltage to the first low-level voltage.

During the time period t3, the afferent signal G[N−1] is maintained in the high-level state, and T1 as well as T5 are both turned off. Since CK3 jumps from the high-level state to the low-level state, T4 is turned on, and T6 as well as T7 are both turned on. T6 is turned on, and the direct-current power supply VGH charges the capacitor C1. In this case, Q[N] is pulled up to the high-level state, and thus T2 and T3 are both turned off. It should be noted that, since during the time period t2, Q[N] is pulled up from the second low-level voltage to the first low-level voltage, Q[N] can be pulled up to the high-level state by the direct-current power supply VGH during a short charge time, and T2 as well as T3 can both be turned off rapidly.

Since T2 is turned off, the first gate signal G[N] is still maintained in the high-level state as in the last time period. T7 is turned on, so that the second gate signal G[N+1] is pulled up to the high-level state by the direct-current power supply VGH. In this case, the direct-current power supply VGH can pull up the electric potentials of Q[N] and the second gate signal G[N+1] continuously until a low-level pulse of an afferent signal G[N−1] of a next frame cycle arrives.

The work procedure of the GOA drive unit of stage N+2 will be illustrated below.

As aforementioned, the structure of the GOA drive unit of stage N+2 is the same as that of the GOA drive unit of stage N, however, the afferent signal and the clock signal of the GOA drive unit of stage N+2 are different from those of the GOA drive unit of stage N. The afferent signal received by the GOA drive unit of stage N+2 is G[N+1], the first clock signal received therein is CK3, and the second clock signal received therein is CK4. In addition, the pull-up signal received by the GOA drive unit of stage N+2 is the clock signal CK1.

As shown in FIG. 2, the afferent signal and the clock signal received by the GOA drive unit of stage N+2 both delay two clock pulses compared with those of the GOA drive unit of stage N. Therefore, the waveform of the electric potential of Q[N+2] delays two clock pulses than that of Q[N], the first gate signal G[N+2] output by the GOA drive unit of stage N+2 delays two clock pulses than G[N], and the second gate signal G[N+3] output by the GOA drive unit of stage N+2 delays two clock pulses than G[N+1].

It can be seen from the above signal sequence analysis that, in the gate drive circuit provided by the present embodiment, the scanning driving of the gate lines in four adjacent rows can be performed according to the periodic changes of CK1, CK2, CK3, and CK4. According to the present embodiment, the scanning driving of the two adjacent gate lines can be controlled by one single stage of drive unit, so that the number of TFTs used therein can be cut down, the structure of the gate drive circuit can be simplified, and the power consumption thereof can be reduced. Moreover, the display device with a narrower frame can be realized.

Embodiment 2

Figure 3:
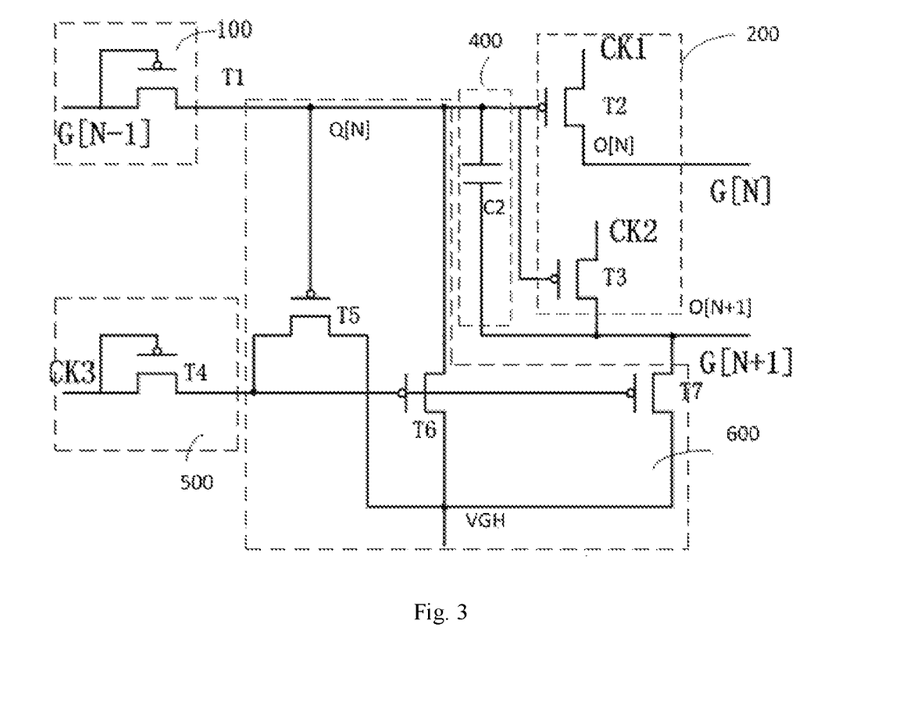
FIG. 3 is a structural diagram of a GOA drive unit according to embodiment 2 of the present disclosure.

FIG. 3 is a structural diagram of a GOA drive unit of stage N according to the present embodiment. The structure of the GOA drive unit of stage N+2 according to the present embodiment is similar to the structure as shown in FIG. 3, but the afferent signal and the clock signal thereof are different.

The structure of the voltage step-down unit 400 according to the present embodiment is different from that as shown in FIG. 1a. Specifically, the voltage step-down unit 400 comprises a second voltage step-down capacitor C2. The first end of the second voltage step-down capacitor C2 is coupled with the control end of the output unit 200 (Q[N] as shown in FIG. 3), a second thereof is coupled with the second end of the second output transistor T3 (O[N] as shown in FIG. 3) so as to pull down the electric potential of Q[N] according to the second clock signal CK2.

Figure 4:
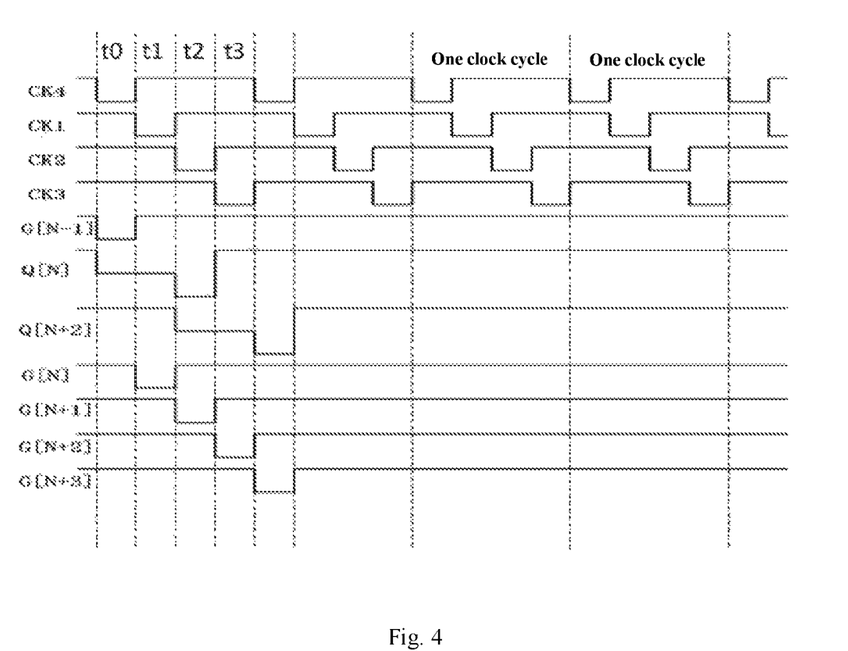
FIG. 4 is an operational sequence diagram of the GOA drive unit according to embodiment 2 of the present disclosure.

The working principle of the GOA drive unit of stage N according to the present embodiment will be illustrated in detail hereinafter with reference to the signal sequence diagram as shown in FIG. 4.

During the time period t0, the afferent signal G[N−1] jumps from a high-level state to a low-level state, and T1 is turned on. The pull-down control signal KD[N] output by T1 is in the low-level state, and thus the electric potential of Q[N] is pulled down to a first low-level voltage. Since Q[N] is in the low-level state, T2, T3, and T5 are all turned on. Since T2 is turned on and CK1 is in the high-level state, the first gate signal G[N] output therein is maintained in the high-level state. Since T3 is turned on and CK2 is in the high-level state, the second gate signal G[N+1] output by T3 is maintained in the high-level state.

Since CK3 is in the high-level state, T4 is turned off. T5 is turned on, so that the gates of T6 and T7 are maintained in the high-level voltage VGH. Therefore, T6 and T7 can be maintained in the stable turned-off state, and the leakage current can be prevented.

During the time period t1, the afferent signal G[N−1] jumps from the low-level state to the high-level state, and T1 is turned off. Q[N] is in the low-level state, and T2, T3, and T5 are all turned on. Since T3 is turned on and CK2 is in the high-level state, the second gate signal G[N+1] output by T3 is maintained in the high-level state. The second end of the capacitor C2 is still maintained in the high-level state as during the time period to. Therefore, during the time period t1, the capacitor C2 is not charged or discharged, and Q[N] is still maintained in the first low-level voltage. Since T2 is turned on, and CK1 jumps from the high-level state to the low-level state, the first gate signal G[N] output by T2 jumps to the low-level state.

During the time period t2, the afferent signal G[N−1] is maintained in the high-level state, and T1 is turned off. Q[N] is in the low-level state, and T2, T3, and T5 are all turned on. At an initial moment of the time period t2, Q[N] has the first low-level voltage, and T2 as well as T3 are both turned on. Since T3 is turned on, and CK2 jumps from the high-level state to the low-level state, the second gate signal G[N+1] output by T3 is in the low-level state. Since the second end (O[N+1] as shown in FIG. 3) of the capacitor C2 jumps from the high-level state to the low-level state, the first end (Q[N] as shown in FIG. 3) of the capacitor C2 changes from the first low-level voltage to a lower second low-level voltage. According to the present embodiment, the gate of T3 is coupled with Q[N], and the first end of T3 is the source and used for receiving the second clock signal CK2. Since T3 is the P-type transistor and the gate thereof has the lower second low-level voltage, a negative voltage difference can be maintained between the gate and the source of T3 in the case that CK2 jumps to the low-level state. In this case, T3 is still in the turned-on state and can output the second gate signal G[N+1] normally. Since T2 is turned on, and CK1 jumps from the low-level state to the high-level state, the first gate signal G[N] output by T2 is in the high-level state.

During the time period t3, the afferent signal G[N−1] is maintained in the high-level state, and T1 as well as T5 are both turned off. Since CK3 jumps from the high-level state to the low-level state, T4 is turned on, and T6 as well as T7 are both turned on. T6 is turned on, and the direct-current power supply VGH charges the capacitor C2. In this case, Q[N] is pulled up to the high-level state, and thus T2 and T3 are both turned off. T2 is turned off, and the first gate signal G[N] is still maintained in the high-level state as in the last time period. T7 is turned on, so that the second gate signal G[N+1] is pulled up to the high-level state by the direct-current power supply VGH.

The work process of the GOA drive unit of stage N+2 is similar to that of the GOA drive unit of stage N. As shown in FIG. 4, the waveform of the electric potential of Q[N+2] delays two clock pulses than that of Q[N], the first gate signal G[N+2] output by the GOA drive unit of stage N+2 delays two clock pulses than G[N], and the second gate signal G[N+3] output by the GOA drive unit of stage N+2 delays two clock pulses than G[N+1].

Embodiment 3

Figure 5:
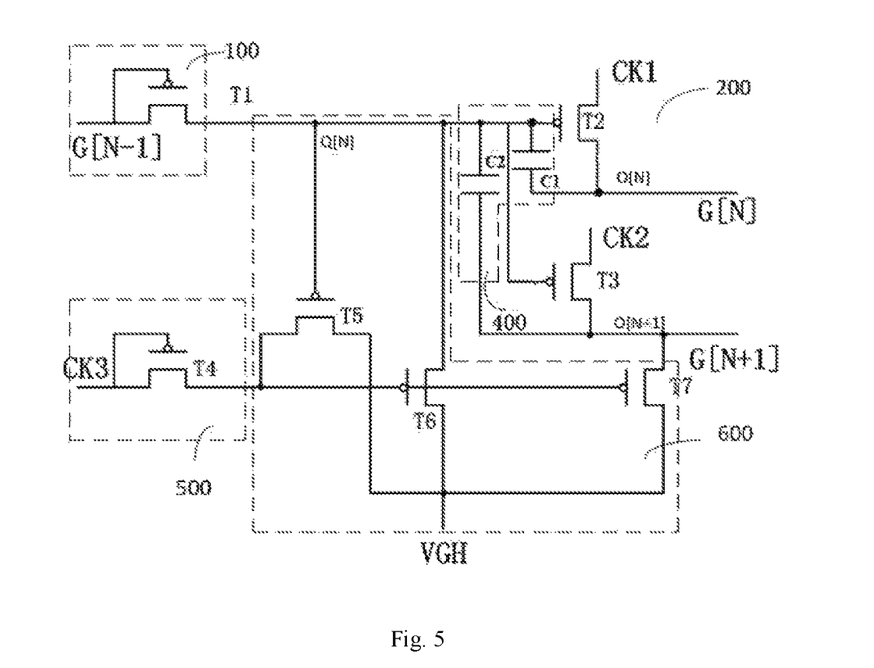
FIG. 5 is a structural diagram of a GOA drive unit according to embodiment 3 of the present disclosure.

FIG. 5 is a structural diagram of a GOA drive unit according to the present embodiment. The circuit is a combination of the two GOA drive units as shown in FIG. 1a and FIG. 3.

Figure 6:
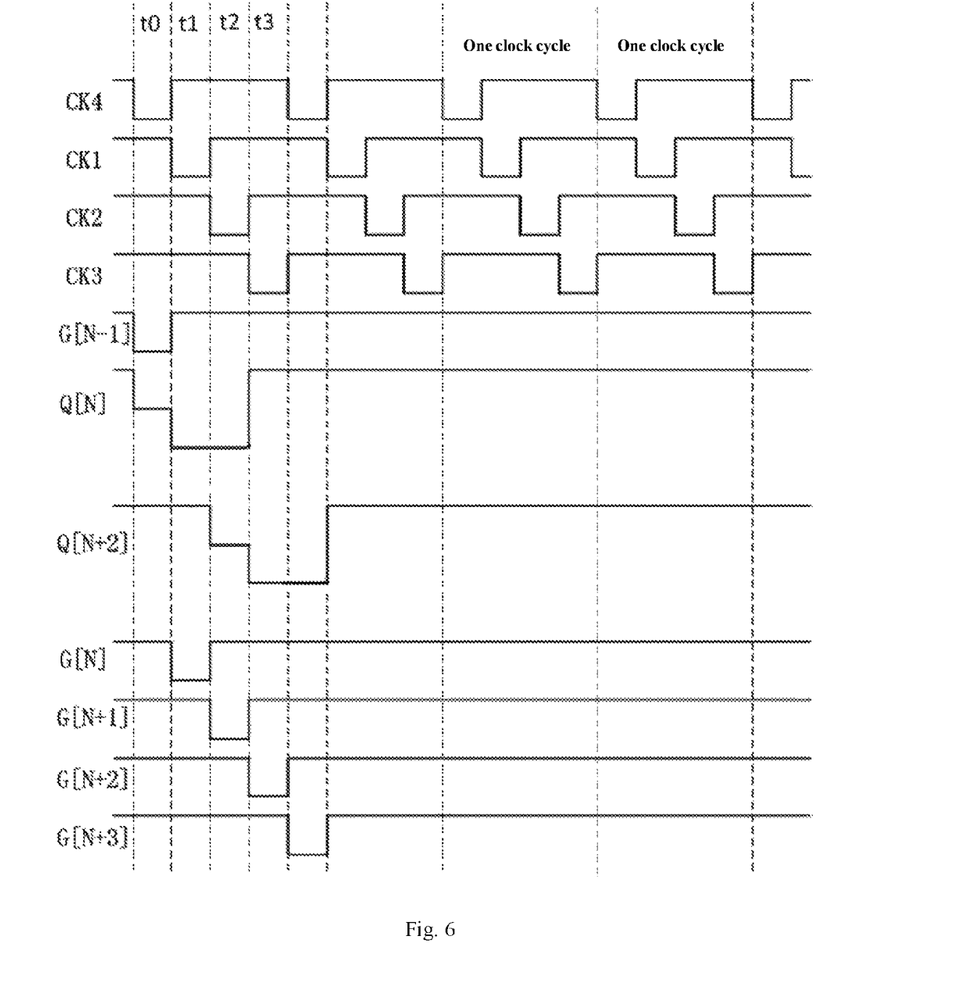
FIG. 6 is an operational sequence diagram of the GOA drive unit according to embodiment 3 of the present disclosure.

The working principle of the GOA drive unit of stage N according to the present embodiment will be illustrated in detail hereinafter with reference to the signal sequence diagram as shown in FIG. 6.

During the time period t0, the afferent signal G[N−1] jumps from a high-level state to a low-level state, and T1 is turned on. The pull-down control signal KD[N] output by T1 is in the low-level state, and thus the electric potential of Q[N] is pulled down to a first low-level voltage. Since Q[N] is in the low-level state, T2, T3, and T5 are all turned on. Since T2 is turned on and CK1 is in the high-level state, the first gate signal G[N] output therein is maintained in the high-level state. Since T3 is turned on and CK2 is in the high-level state, the second gate signal G[N+1] output by T3 is maintained in the high-level state.

During the time period t1, the afferent signal G[N−1] jumps from the low-level state to the high-level state, and T1 is turned off. Q[N] is in the low-level state, and T2, T3, and T5 are all turned on. Since T3 is turned on and CK2 is in the high-level state, the second gate signal G[N+1] output by T3 is maintained in the high-level state. Since T2 is turned on, and CK1 jumps from the high-level state to the low-level state, the first gate signal G[N] output by T2 jumps to the low-level state. At an initial moment of the time period t1, since the second end (O[N] as shown in FIG. 5) of the capacitor C1 jumps from the high-level state to the low-level state, the first end (Q[N] as shown in FIG. 5) of the capacitor C1 changes from the first low-level voltage to a lower second low-level voltage. According to the present embodiment, the gate of T2 is coupled with Q[N], and the first end of T2 is the source and used for receiving the first clock signal CK1. Since T2 is the P-type transistor and the gate thereof has the lower second low-level voltage, a negative voltage difference can be maintained between the gate and the source of T2 in the case that CK1 jumps to the low-level state. In this case, T2 is still in the turned-on state and can output the first gate signal G[N] normally.

During the time period t2, the afferent signal G[N−1] is maintained in the high-level state, and T1 is turned off. Q[N] is in the low-level state, and T2, T3, and T5 are all turned on. At an initial moment of the time period t2, Q[N] has the second low-level voltage, and T2 as well as T3 are both turned on.

Since T3 is turned on, and CK2 jumps from the high-level state to the low-level state, the second gate signal G[N+1] output by T3 is in the low-level state. The second end (O[N+1] as shown in FIG. 5) of the capacitor C2 jumps from the high-level state to the low-level state, and thus the electric potential of Q[N] can be pulled down. At the same time, since T2 is turned on, and CK1 jumps from the low-level state to the high-level state, the first gate signal G[N] output by T2 is in the high-level state. The second end (O[N] as shown in FIG. 5) of the capacitor C1 jumps from the low-level state to the high-level state, and thus the electric potential of Q[N] can be pulled up. According to the present embodiment, the electric performance of the transistor T2 is the same as that of the transistor T3, and preferably, the capacitance of C1 is the same as that of C2. With respect to the electric potential of Q[N], the pull-up effect of the clock signal CK1 and the pull-down effect of the clock signal CK2 are neutralized, and thus Q[N] can be maintained in the second low-level voltage.

In this case, on the one hand, a negative voltage difference can be maintained between the gate and the source of T3 in the case that CK2 jumps to the low-level state, and thus T3 is still in the turned-on state, and can output the second gate signal G[N+1] normally. On the other hand, Q[N] can be avoided to be pulled down to a lower electric potential by the pull-down effect of CK2, and the over-long charge time on C1 and C2 performed by the direct-current power supply VGH during the time period t3 can be prevented.

During the time period t3, the afferent signal G[N−1] is maintained in the high-level state, and T1 as well as T5 are both turned off. Since CK3 jumps from the high-level state to the low-level state, T4 is turned on, and T6 as well as T7 are both turned on. T6 is turned on, and the direct-current power supply VGH charges the capacitors C1 and C2. In this case, Q[N] is pulled up to the high-level state, and thus T2 and T3 are both turned off. T2 is turned off, and the first gate signal G[N] is still maintained in the high-level state as in the last time period. T7 is turned on, so that the second gate signal G[N+1] is pulled up to the high-level state by the direct-current power supply VGH. It should be noted that, since during the time period t2, Q[N] is maintained in the second low-level voltage, Q[N] can be pulled up to the high-level state by the direct-current power supply VGH during a short charge time, and T2 as well as T3 can both be turned off rapidly.

Therefore, the electric potential of Q[N] can be regulated by the capacitors C1 and C2. In this case, the electric potential of Q[N] can be pulled down during the effective periods of the gate lines of row N and row N+1, so that T2 and T3 can both output normally. At the same time, the second output transistor T3 can be turned off rapidly when the gate line of row N+1 is switched over from an effective state to a non-effective state.

In addition, the direct-current power supply VGH has a high-level constant voltage. The technical problem of lengthy circuit structure of the pull-down sustaining circuit of the LTPS GOA circuit in the prior art during the non-effective period can be solved in combination with the cooperation functions of the four clock signal sources and the voltage step-down unit, and the pull-down sustaining function can be realized.

Embodiment 4

Figure 7:
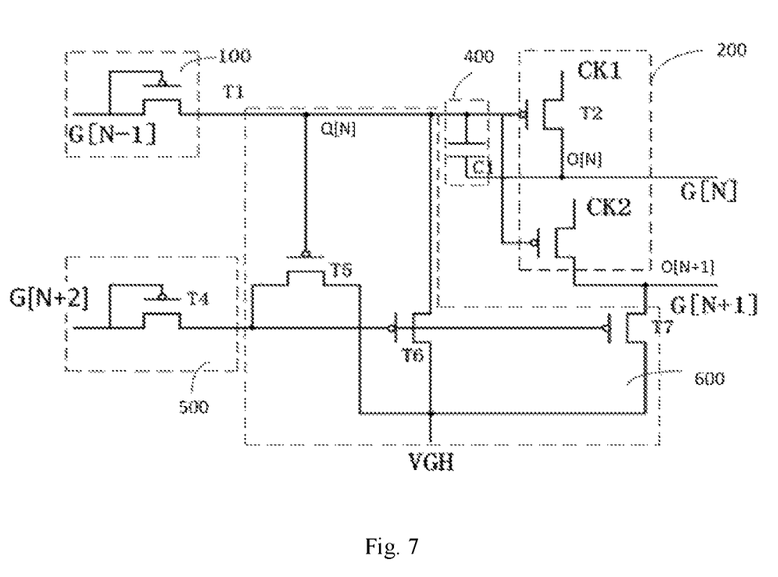
FIG. 7 is a structural diagram of a GOA drive unit according to embodiment 4 of the present disclosure.

FIG. 7 is a structural diagram of a GOA drive unit of stage N according to the present embodiment. The pull-up control unit 500 is further improved on the basis of the circuit structure as shown in FIG. 1a. It should be noted that, the GOA drive unit of stage N+2 (not shown in the drawings) is improved accordingly.

Specifically, the pull-up signal received by the pull-up control unit 500 is the first gate signal G[N+2] output by the GOA drive unit of stage N+2. The specific signal sequence and the analysis thereof are similar to those as shown in FIG. 2, the details of which are no longer repeated here.

According to the present embodiment, the signal G[N+2] output by the GOA drive unit of a next stage is input to the gate of T4 of the GOA drive unit of a present stage based on the circuit structure of embodiment 1, so that the stability of the pull-up control unit 500 and the pull-up sustaining unit 600 during the non-effective period can be ensured.

It should be noted that, embodiment 2 and embodiment 3 are both applicable to embodiment 4.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A gate drive circuit, comprising a multi-stage GOA drive unit, wherein each stage of GOA drive unit comprises:
a signal afferent unit, used for outputting a pull-down control signal according to an afferent signal;
an output unit, wherein a control end thereof is coupled with an output end of the signal afferent unit so as to pull down an electric potential of an output end of a first gate signal according to the pull-down control signal and a first clock signal and an electric potential of an output end of a second gate signal according to the pull-down control signal and a second clock signal, so that the stage of GOA drive unit outputs a first gate signal and a second gate signal, said first gate signal and said second gate signal being scanning signals of two adjacent gate lines;
a pull-up control unit, used for outputting a pull-up control signal according to a pull-up signal; and
a pull-up sustaining unit, coupled among an output end of the pull-up control unit, the control end of the output unit, the output end of the second gate signal, and a direct-current power supply, and used for pulling up an electric potential of the control end of the output unit to an electric potential of the direct-current power supply according to the pull-up control signal, so that the first gate signal and the second gate signal are both maintained in a high-level state.

2. The gate drive circuit according to claim 1, wherein the output end of the second gate signal of each stage of GOA drive unit is coupled with an input end of a signal afferent unit of a next stage of GOA drive unit, so that the next stage of GOA drive unit is turned on according to the second gate signal output by a present stage of GOA drive unit.

3. The gate drive circuit according to claim 2, wherein said signal afferent unit comprises a signal afferent transistor, a gate thereof being short circuited with a first end thereof so as to receive afferent signal, and a second end thereof being coupled with the control end of the output unit.

4. The gate drive circuit according to claim 1, wherein the first clock signal and the second clock signal of each stage of GOA drive unit and the first clock signal and the second clock signal of the next stage of GOA drive unit constitute a clock cycle, and are staggered and connected with one another in time-sequence.

5. The gate drive circuit according to claim 4, wherein the pull-up signal of each stage of GOA drive unit is the first clock signal of the next stage of GOA drive unit, or the first gate signal output by the next stage of GOA drive unit.

6. The gate drive circuit according to claim 4, wherein said pull-up sustaining unit comprises:

a first pull-up transistor, a gate thereof being coupled with the output end of said pull-up control unit, a first end thereof being coupled with the direct-current power supply, and a second end thereof being coupled with the control end of the output unit; and a second pull-up transistor, a gate thereof being coupled with the output end of said pull-up control unit, a first end thereof being coupled with the direct-current power supply, and a second end thereof being coupled with the output end of the second gate signal of the output unit, wherein the first pull-up transistor and the second pull-up transistor are turned on when the pull-up control signal is effective, so that the electric potential of the control end of the output unit is pulled up to the electric potential of the direct-current power supply, and the second gate signal is pulled up to the electric potential of the direct-current power supply.

7. The gate drive circuit according to claim 6, wherein said pull-up sustaining unit further comprises:

a leak-proofing transistor, a gate thereof being coupled with the control end of the output unit, a first end thereof being coupled with the direct-current power supply, and a second end thereof being coupled with the gates of the first pull-up transistor and the second pull-up transistor, wherein said leak-proofing transistor is turned on when the control end of the output unit is in a low-level state, so that the gates of the first pull-up transistor and the second pull-up transistor are both maintained in a high-level state, and leakage current from the direct-current power supply to the control end of the output unit is prevented.

8. The gate drive circuit according to claim 6, wherein said pull-up control unit comprises a pull-up control transistor, a gate thereof being short circuited with a first end thereof so as to receive the pull-up signal, and a second end thereof being coupled with the gates of the first pull-up transistor and the second pull-up transistor.

9. The gate drive circuit according to claim 1, wherein said output unit comprises:

a first output transistor, wherein a gate thereof is coupled with the output end of the signal afferent unit, a first end thereof receives a first clock signal, and a second end thereof outputs the first gate signal; and a second output transistor, wherein a gate thereof is coupled with the output end of the signal afferent unit, a first end thereof receives a second clock signal, and a second end thereof outputs the second gate signal.

10. The gate drive circuit according to claim 9, further comprising a voltage step-down unit, which comprises a first voltage step-down capacitor and/or a second voltage step-down capacitor, wherein a first end of the first voltage step-down capacitor is coupled with the control end of the output unit, a second thereof is coupled with the second end of said first output transistor so as to pull down or pull up the electric potential of the control end of the output unit according to the first clock signal; and wherein a first end of the second voltage step-down capacitor is coupled with the control end of the output unit, a second thereof is coupled with the second end of said second output transistor so as to pull down the electric potential of the control end of the output unit according to the second clock signal.

* * * * *